(12) United States Patent
Chen et al.

(10) Patent No.: US 10,413,066 B2
(45) Date of Patent: Sep. 17, 2019

(54) SLIDE RAIL ASSEMBLY AND RAIL KIT THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 26 days.

(21) Appl. No.: 15/866,560

(22) Filed: Jan. 10, 2018

(65) Prior Publication Data

US 2019/0045924 A1 Feb. 14, 2019

(30) Foreign Application Priority Data

Aug. 10, 2017 (TW) .............................. 106127400 A (51) Int. Cl.
| | |
|---|---|
| *A47B 88/00* | (2017.01) |
| *A47B 88/50* | (2017.01) |
| *A47B 88/49* | (2017.01) |
| *A47B 88/40* | (2017.01) |
| *E05B 65/46* | (2017.01) |
| *F16C 29/10* | (2006.01) |
| *A47B 88/423* | (2017.01) |
| *A47B 88/483* | (2017.01) |

(52) U.S. Cl.
CPC .............. *A47B 88/50* (2017.01); *A47B 88/40* (2017.01); *A47B 88/49* (2017.01); *A47B 88/483* (2017.01); *A47B 2088/4235* (2017.01); *A47B 2210/0018* (2013.01); *E05B 65/46* (2013.01); *F16C 29/10* (2013.01)

(58) Field of Classification Search
CPC ....... A47B 88/493; A47B 88/43; A47B 88/57; A47B 88/487; A47B 88/49; A47B 88/50; H05K 7/1489
See application file for complete search history.

(56) References Cited

U.S. PATENT DOCUMENTS

| | | |
|---|---|---|
| 6,412,891 B1 | 7/2002 | Liang et al. |
| 6,935,710 B2 | 8/2005 | Chen et al. |

(Continued)

FOREIGN PATENT DOCUMENTS

JP          2017074351 A       4/2017

*Primary Examiner* — Kimberley S Wright
(74) *Attorney, Agent, or Firm* — Alan D. Kamrath; Mayer & Williams PC (57) ABSTRACT

A slide rail assembly includes a first rail, a second rail and a locking device. The first rail includes a blocking part. The second rail is movable relative to the first rail. The locking device is arranged on the second rail. The locking device includes a first part and a second part. A first space is defined between the first part and the second part. When the second rail is located at a predetermined position relative to the first rail, a second space is defined between the first part and the second part and configured to accommodate the blocking part, and the first part and the second part of the locking device are configured to respectively block two sides of the blocking part of the first rail.

16 Claims, 8 Drawing Sheets

(56) References Cited

U.S. PATENT DOCUMENTS

| | | | |
|---|---|---|---|
| 7,571,968 B2* | 8/2009 | Ji | A47B 88/493 312/333 |
| 7,918,517 B2* | 4/2011 | Chen | A47B 88/57 312/334.46 |
| 8,371,542 B2* | 2/2013 | Zhang | H05K 7/1489 248/220.21 |
| 8,585,164 B2* | 11/2013 | Chen | A47B 88/49 312/333 |
| 9,301,609 B2 | 4/2016 | Muller et al. | |
| 9,980,565 B2* | 5/2018 | Chen | F16C 29/123 |
| 10,041,535 B2* | 8/2018 | Chen | F16C 29/10 |
| 10,111,357 B2* | 10/2018 | Chen | A47B 88/57 |
| 10,213,017 B2* | 2/2019 | Chen | H05K 7/1489 |
| 2004/0174102 A1* | 9/2004 | Chen | A47B 88/487 312/334.46 |
| 2005/0074190 A1 | 4/2005 | Traiser et al. | |
| 2006/0163983 A1 | 7/2006 | Wu | |
| 2008/0111457 A1* | 5/2008 | Ji | A47B 88/493 312/334.44 |
| 2008/0124009 A1* | 5/2008 | Peng | A47B 88/57 384/21 |
| 2008/0246378 A1 | 10/2008 | Chen et al. | |
| 2009/0096340 A1* | 4/2009 | Chen | A47B 88/493 312/334.46 |
| 2012/0061551 A1* | 3/2012 | Zhang | H05K 7/1489 248/560 |
| 2013/0058596 A1* | 3/2013 | Chen | F16C 29/005 384/7 |

* cited by examiner

SLIDE RAIL ASSEMBLY AND RAIL KIT THEREOF

BACKGROUND OF THE INVENTION

1. Field of the Invention

The present invention relates to a slide rail assembly, and more particularly, to a slide rail assembly having a locking mechanism.

2. Description of the Prior Art

Generally, a slide rail assembly comprises a first rail and a second rail movable relative to the first rail. Wherein, when the second rail is moved relative to the first rail along a direction to a predetermined position, a blocking structure arranged between the first rail and the second rail can prevent the second rail from being further moved relative to the first rail along the direction, in order to hold the second rail at the predetermined position. As related technology keeps improving, a slide rail assembly is provided to have a second rail configured to be blocked by a blocking mechanism at a predetermined position relative to the first rail, and an operating member configured to be operated to unlock the blocking mechanism in order to allow the second rail to be moved relative to the first rail along a direction. For example, U.S. Pat. No. 6,412,891 B1 discloses a slide assembly comprising an outer member (20), an inner member (30), a stop member (50) and a pivot member (70). Wherein, the pivot member (70) is pivoted to the inner member (30). When the inner member (30) is located at a position relative to the outer member (20), the pivot member (70) and the stop member (50) block each other to prevent the inner member (30) from being moved relative to the outer member (20).

However, for different market requirements, it is important to provide different slide rail assemblies applicable in limited space, in order to facilitate equipment maintenance.

SUMMARY OF THE INVENTION

The present invention relates to a slide rail assembly having a locking mechanism and a rail kit thereof.

According to an embodiment of the present invention, a slide rail assembly comprises a first rail, a second rail, a first locking device and a second locking device. The first rail comprises a blocking part. The second rail is movable relative to the first rail. The first locking device is arranged on the second rail. The first locking device comprises a first member and a second member. The first member comprises a first part. The second member comprises a second part. A first space is defined between the first part and the second part, wherein the first space is not able to accommodate the blocking part. The second locking device is arranged on the second rail. The second locking device comprises a third member and a fourth member. The third member comprises a third part. The fourth member comprises a fourth part. Wherein, during a process of the second rail being moved relative to the first rail from a retracted position to a first predetermined position along a first direction, the second part of the second member is blocked by the blocking part of the first rail, and the first member is moved with the second rail along the first direction, such that a second space is defined between the first part and the second part, and the second space is configured to accommodate the blocking part of the first rail, in order to lock the blocking part to the first locking device. Wherein, when the first locking device is operated to unlock the blocking part, and the second rail is further moved relative to the first rail to a second predetermined position along the first direction, a third space defined between the third part and the fourth part is configured to accommodate the blocking part of the first rail, in order to lock the blocking part to the second locking device.

Preferably, when the second locking device is operated to unlock the blocking part, the second rail is movable relative to the first rail from the second predetermined position to the retracted position along a second direction.

Preferably, the first member is fixed to the second rail, and the second member is movable relative to the second rail within a limited range through a guiding feature.

Preferably, the first member further comprises a first elastic section. The first part is arranged at an end of the first elastic section. The second member further comprises a second elastic section. The second part is arranged at an end of the second elastic section.

Preferably, the first elastic section is located between the second rail and the second elastic section, and the first elastic section and the second elastic section are tilted relative to the second rail.

Preferably, the second member further comprises a first extension section connected to the second elastic section. The second rail further comprises a first supporting part configured to abut against the first extension section.

Preferably, the third member further comprises a third elastic section. The third part is arranged at an end of the third elastic section. The fourth member further comprises a fourth elastic section. The fourth part is arranged at an end of the fourth elastic section.

Preferably, the third elastic section is located between the second rail and the fourth elastic section, and the third elastic section and the fourth elastic section are tilted relative to the second rail.

Preferably, the fourth member further comprises a second extension section connected to the fourth elastic section. The second rail further comprises a second supporting part configured to abut against the second extension section.

Preferably, the first rail has a front end and a rear end. The blocking part is arranged adjacent to the front end.

Preferably, the first locking device and the second locking device are arranged at different positions on the second rail along a longitudinal direction of the second rail.

Preferably, the slide rail assembly further comprises an elastic member configured to apply an elastic force to the second member.

According to another embodiment of the present invention, a slide rail assembly comprises a first rail, a second rail and a first locking device. The first rail comprises a blocking part. The second rail is movable relative to the first rail. A first locking device is arranged on the second rail. The first locking device comprises a first part and a second part. A first space is defined between the first part and the second part and unable to accommodate the blocking part. When the second rail is located at a first predetermined position relative to the first rail, a second space is defined between the first part and the second part and configured to accommodate the blocking part. The first part and the second part of the first locking device are configured to respectively block two sides of the blocking part of the first rail.

According to another embodiment of the present invention, a rail kit comprises a slide rail and a first locking device. The first locking device is arranged on the slide rail. The first locking device comprises a first member and a second member. The first member is fixed to the slide rail.

The second member is movably mounted to the slide rail. When the second member is moved relative to the slide rail, a first space defined between the first member and the second member is changed to a second space; wherein the second space is larger than the first space.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
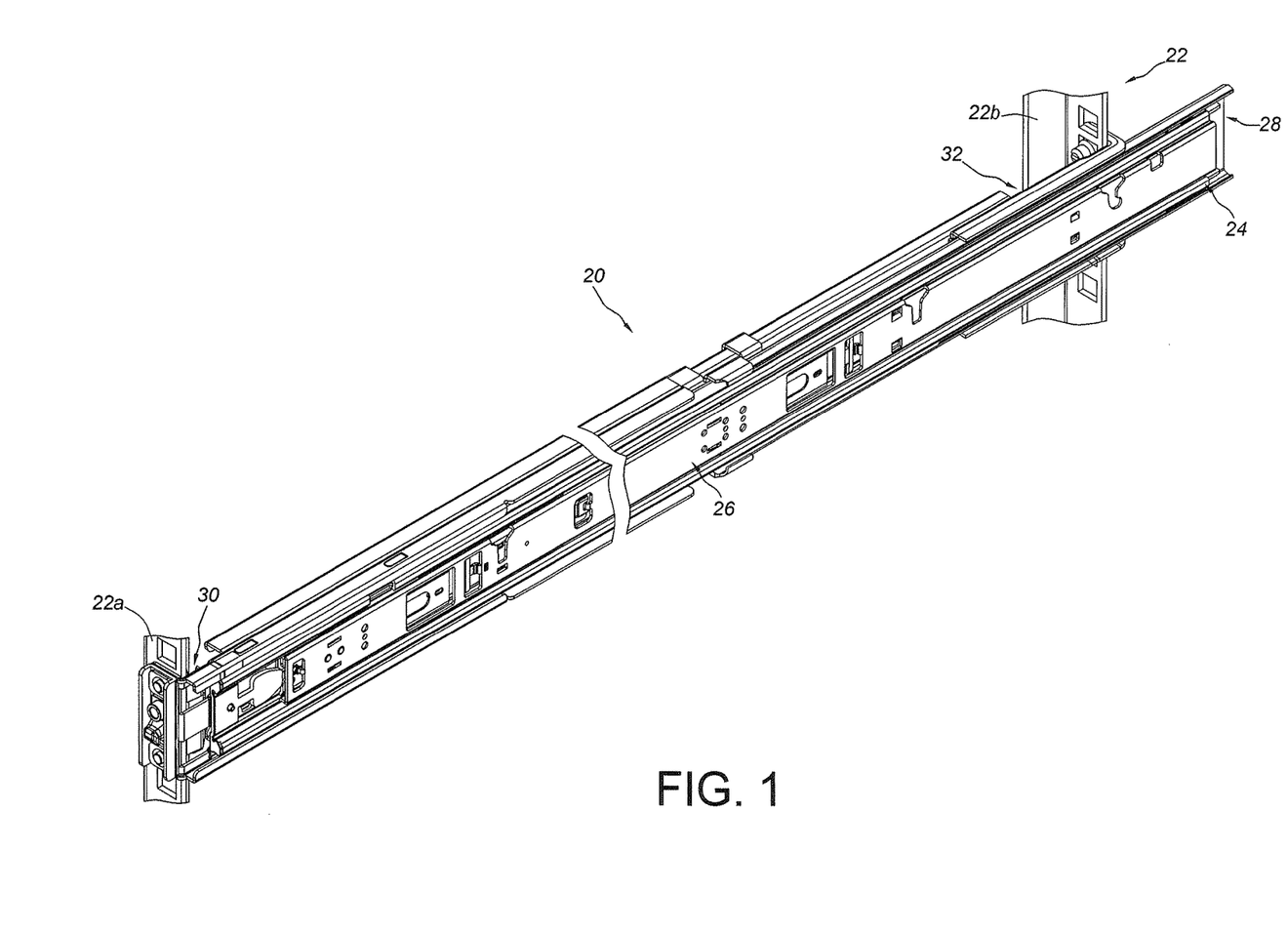
FIG. 1 is a diagram showing a slide rail assembly being mounted to one side of a rack according to a first embodiment of the present invention.
Figures 2, 3:
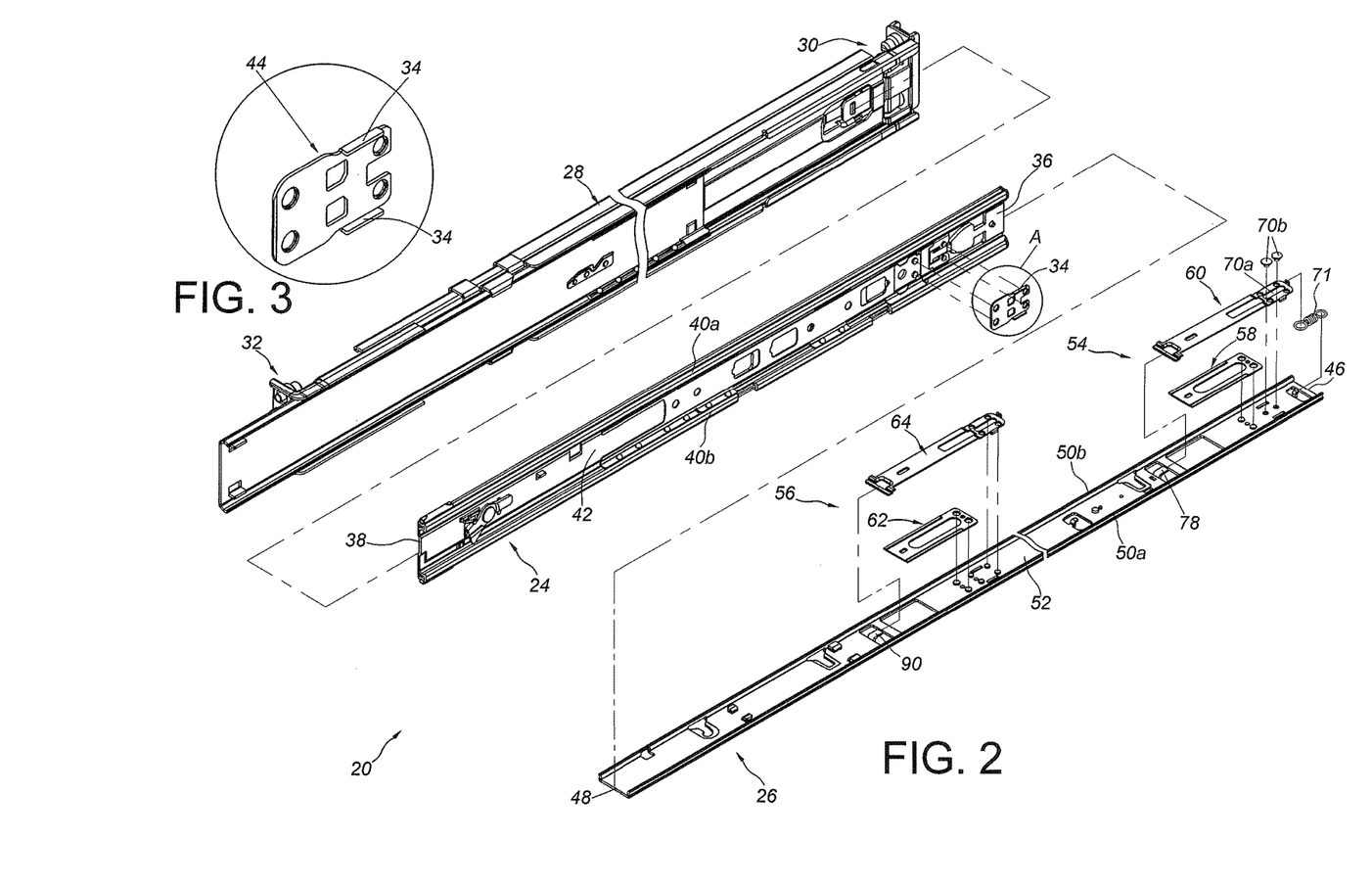
FIG. 2 is an exploded view of the slide rail assembly according to the first embodiment of the present invention.
FIG. 3 is an enlarged view of an area A of FIG. 2.

As shown in FIG. 1 and FIG. 2, a slide rail assembly 20 according to an embodiment of the present invention comprises a first rail 24 and a second rail 26 movable relative to the first rail 24. Preferably, the slide rail assembly 20 further comprises a third rail 28. The first rail 24 is movably mounted between the third rail 28 and the second rail 26. Wherein, the third rail 28 can be mounted to a first post 22a and a second post 22b of a rack 22 through a first bracket 30 and a second bracket 32.

As shown in FIG. 2, the first rail 24 is movably mounted to the third rail 28. The first rail 24 comprises at least one blocking part 34 (please also refer to FIG. 3). In addition, the first rail 24 has a front end 36 and a rear end 38, and the first rail 24 comprises a first wall 40a, a second wall 40b, and a side wall 42 connected between the first wall 40a and the second wall 40b. A passage is defined by the first wall 40a, the second wall 40b and the side wall 42. Preferably, the at least one blocking part 34 is arranged on the side wall 42 and adjacent to the front end 36 of the first rail 24. Wherein, the at least one blocking part 34 can be a protrusion directly formed on the side wall 42 of the first rail 24, or an additional component 44, which comprises the at least one blocking part 34, can be fixedly connected to the first rail 24 by riveting, welding or screwing. The at least one blocking part 34 is protruded relative to the side wall 42 of the first rail 24. But the present invention is not limited thereto.

The second rail 26 (also referred to as slide rail) is movably mounted into the passage of the first rail 24. The second rail 26 has a front end 46 and a rear end 48, and the second rail 26 comprises a first wall 50a, a second wall 50b and a side wall 52 connected between the first wall 50a and the second wall 50b.

Figure 4:
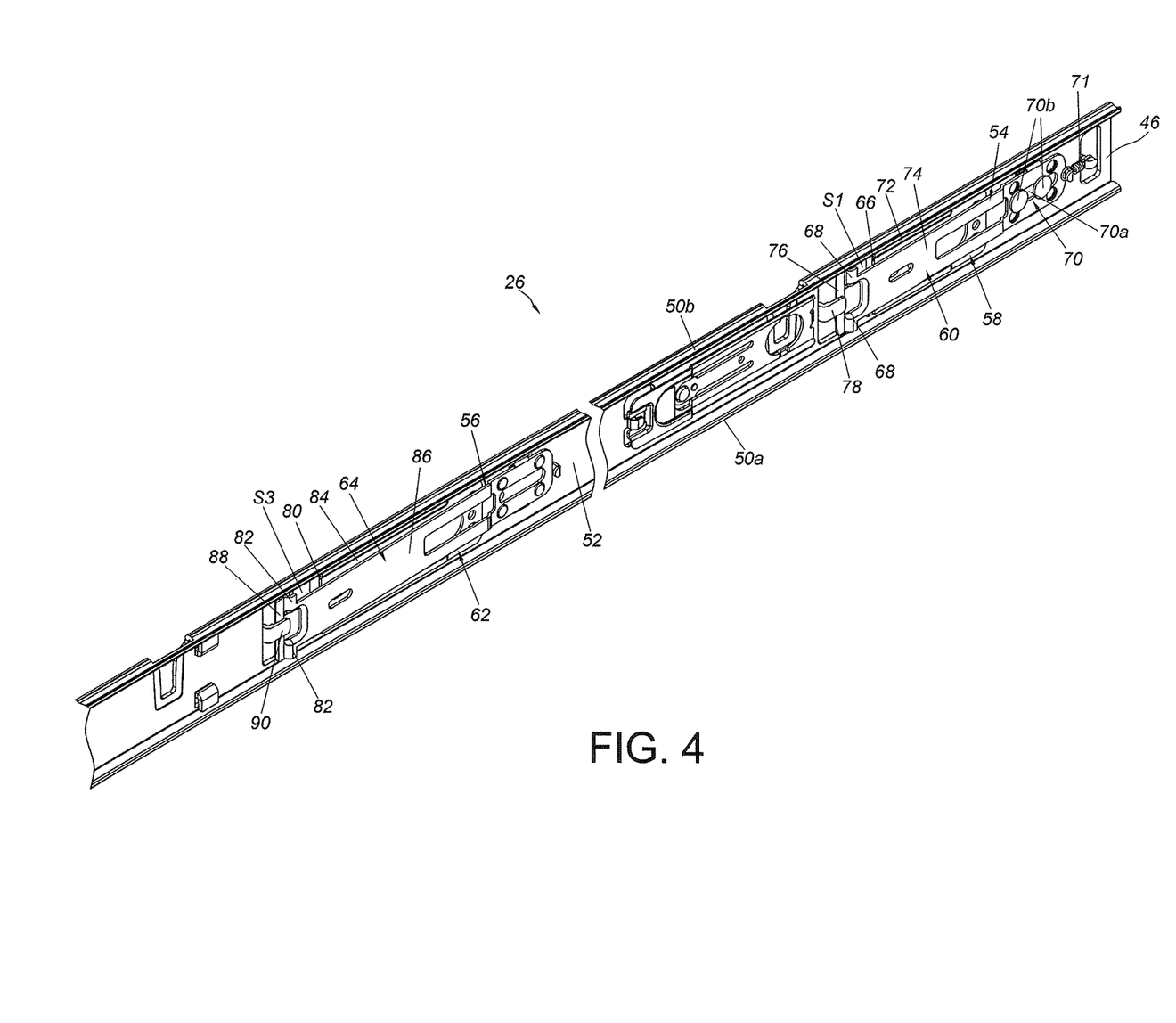
FIG. 4 is a diagram showing a rail kit according to the first embodiment of the present invention.

As shown in FIG. 2 and FIG. 4, the slide rail assembly 20 comprises a first locking device 54. Preferably, the slide rail assembly 20 further comprises a second locking device 56. Both the first locking device 54 and the second locking device 56 are arranged on the second rail 26, such as on the side wall 52 of the second rail 26. Wherein, the first locking device 54 comprises a first member 58 and a second member 60. On the other hand, the second locking device 56 comprises a third member 62 and a fourth member 64.

Wherein, the second rail 26 and the first locking device 54 (and the second locking device 56) form a rail kit. The first locking device 54 and the second locking device 56 are arranged at different positions on the second rail 26 along a longitudinal direction of the second rail 26. Preferably, the first locking device 54 is arranged to be close to the front end 46 of the second rail 26, and the second locking device 56 is arranged to be away from the front end 46 of the second rail 26.

Specifically, the first member 58 of the first locking device 54 comprises a first part 66, and the second member 60 of the first locking device 54 comprises a second part 68. A first space S1 is defined between the first part 66 and the second part 68. Preferably, the first member 58 is fixed to the second rail 26. For example, the first member 58 is fixedly connected to the second rail 26 by riveting, welding or screwing, to be seen as a portion of the second rail 26. In addition, the second member 60 is stacked on the first member 58. The second member 60 is movable relative to the second rail 26 within a limited range through a guiding feature 70. Specifically, since the second member 60 is movable relative to the second rail 26, the space defined between the first part 66 and the second part 68 can be changed from the first space S1 to a second space S2 (please also refer to FIG. 6 and FIG. 7). In the present embodiment, the second member 60 has a bounded elongated hole 70a (or an elongated groove), configured to allow least one connecting member 70b (such as two connecting members) to partially pass through in order to movably mount the second member 60 to the second rail 26. As such, the elongated hole 70a (or elongated groove) and the at least one connecting member 70b form the guiding feature. Preferably, the slide rail assembly 20 further comprises an elastic member 71 configured to apply an elastic force to the second member 60.

The first member 58 further comprises a first elastic section 72. The first part 66 is arranged at an end of the first elastic section 72. The second member 60 further comprises a second elastic section 74. The second part 68 is arranged at an end of the second elastic section 74. Preferably, the first elastic section 72 is located between the second rail 26 and the second elastic section 74, and the first elastic section 72 and the second elastic section 74 are slightly tilted relative to the side wall 52 of the second rail 26. The second member 60 further comprises a first extension section 76 connected to the second elastic section 74. The second rail 26 further comprises a first supporting part 78 configured to abut against the first extension section 76, in order to prevent the second member 60 and/or the first member 58 from being overly tilted.

On the other hand, the third member 62 of the second locking device 56 comprises a third part 80, and the fourth member 64 of the second locking device 56 comprises a fourth part 82. A third space S3 is defined between the third part 80 and the fourth part 82. Preferably, the third member 62 is fixed to the second rail 26. For example, the third member 62 is fixedly connected to the second rail 26 by riveting, welding or screwing, to be seen as a portion of the second rail 26. Preferably, the third member 62 further comprises a third elastic section 84. The third part 80 is arranged at an end of the third elastic section 84. The fourth member 64 is stacked on the third member 62. The fourth member 64 further comprises a fourth elastic section 86. The fourth part 82 is arranged at an end of the fourth elastic section 86.

Preferably, the third elastic section 84 is located between the second rail 26 and the fourth elastic section 86, and the third elastic section 84 and the fourth elastic section 86 are slightly tilted relative to the side wall 52 of the second rail 26. The fourth member 64 further comprises a second extension section 88 connected to the fourth elastic section 86. The second rail 26 further comprises a second supporting part 90 configured to abut against the second extension section 88, in order to prevent the fourth member 64 and/or the third member 62 from being overly tilted.

Figure 5:
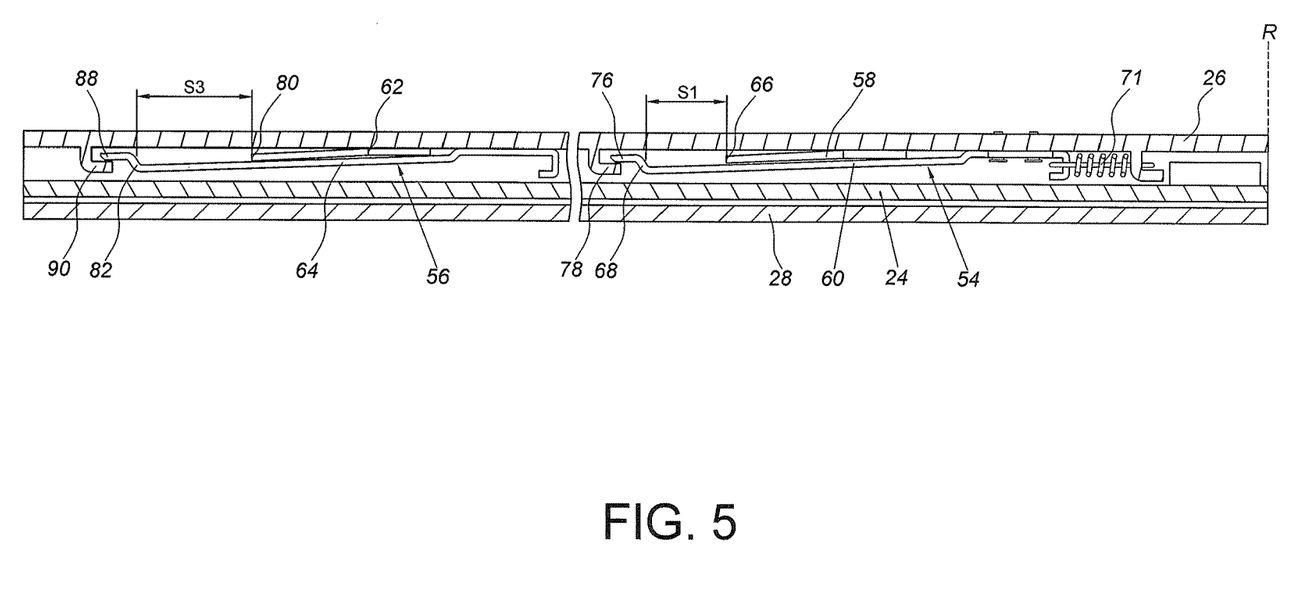
FIG. 5 is a diagram showing the slide rail assembly being in a retracted state according to the first embodiment of the present invention.

As shown in FIG. 5, the second rail 26 and the first rail 24 are located at a retracted position R relative to the third rail 28. Wherein, the first locking device 54, the second locking device 56 and the elastic member 71 are respectively in an initial state. Furthermore, the first space S1 is defined between the first part 66 of the first member 58 and the second part 68 of the second member 60. On the other hand, the third space S3 is defined between the third part 80 of the third member 62 and the fourth part 82 of the fourth member 64.

Figure 6:
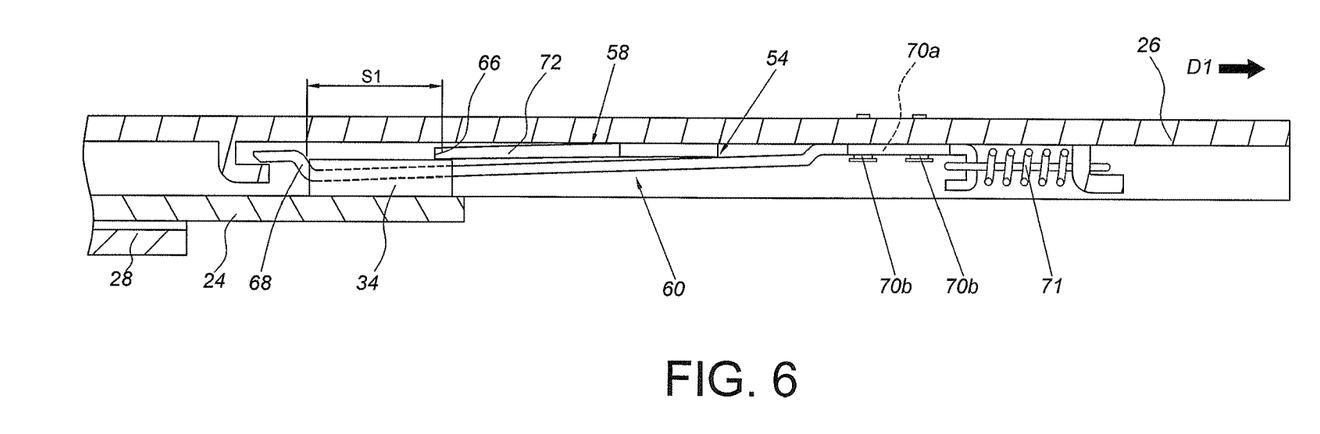
FIG. 6 is a diagram showing a second rail of the slide rail assembly being moved along a first direction according to the first embodiment of the present invention.
Figure 7:
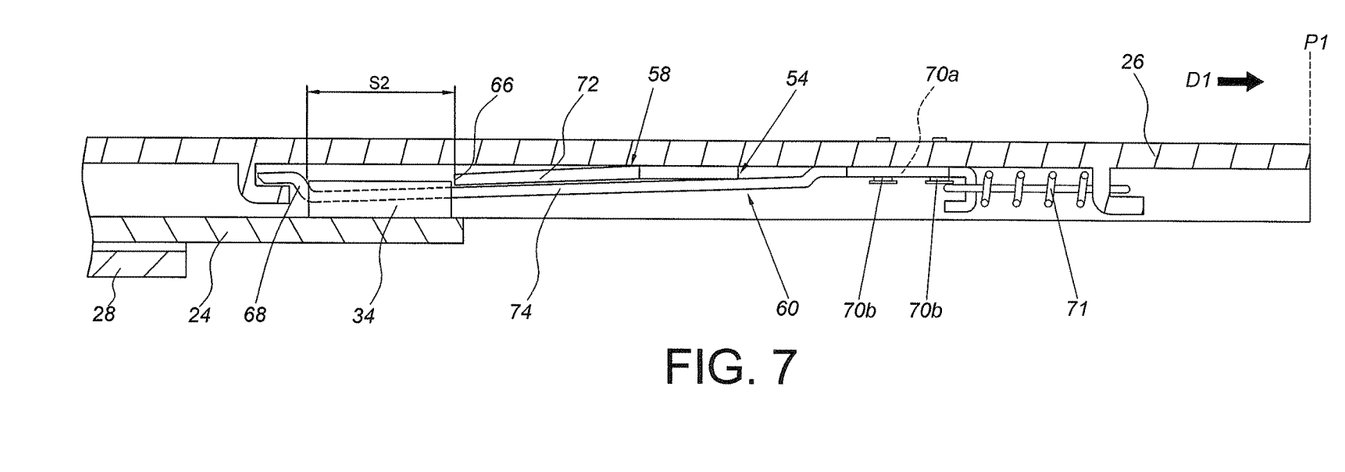
FIG. 7 is a diagram showing the second rail being locked to the first rail through a first locking device when the second rail is located at a first predetermined position according to the first embodiment of the present invention.

As shown in FIG. 6 and FIG. 7, the second rail 26 and the first rail 24 are pulled out to move relative to the third rail 28 from the retracted position R along a first direction D1. When the first rail 24 is in a predetermined extension state relative to the third rail 28, the second rail 26 can be further operated by a user to move relative to the first rail 24 and the third rail 28 along the first direction D1.

During a process of the second rail 26 being moved to a first predetermined position P1 along the first direction D1, the second part 68 of the second member 60 of the first locking device 54 can be blocked by one side of the blocking part 34 of the first rail 24. On the other hand, the first elastic section 72 of the first member 58 is temporarily pressed by the blocking part 34 to accumulate an elastic energy (as shown in FIG. 6). When a force applied to the second rail 26 by the user is large enough to overcome the elastic force of the elastic member 71, the second rail 26 attached with the first member 58 can be further moved to the first predetermined position P1 along the first direction D1 (as shown in FIG. 7), such that the space between the first part 66 of the first member 58 and the second part 68 of the second member 60 can be changed from the first space S1 to the second space S2. Accordingly, the first elastic section 72 is no longer pressed by the blocking part 34 to further release the elastic energy, such that the first part 66 of the first member 58 is located at the other side of the blocking part 34 of the first rail 24. Wherein, the second space S2 is larger than the first space S1, and the second space S2 is configured to accommodate the blocking part 34 of the first rail 24, in order to lock the blocking part 34 (also referred to as object) of the first rail 24 to the first locking device 54. In other words, the first part 66 and the second part 68 of the first locking device 54 can respectively block two sides of the blocking parts 34 of the first rail 24. As such, the second rail 26 can be prevented from moving relative to the first rail 24 along the first direction D1 or a second direction (a direction opposite to the first direction D1). In such state, the slide rail assembly 20 has a first extension length, and the second rail 26 is in a first extension state relative to the first rail 24. Wherein, when the first locking device 54 locks the blocking part 34, the elastic member 71 accumulates the elastic force.

Figure 8:
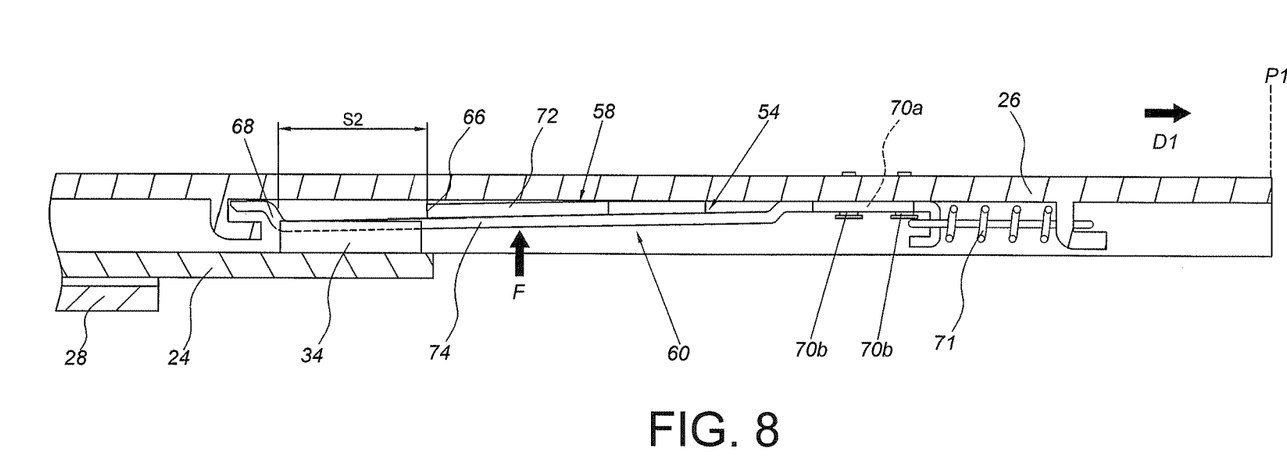
FIG. 8 is a diagram showing the first locking device being operated according to the first embodiment of the present invention.

As shown in FIG. 8, when the first locking device 54 locks the blocking part 34, the user can apply a force F to the second elastic section 74 of the second member 60 and the first elastic section 72 of the first member 58, in order to drive the second part 58 of the second member 60 and the first part 66 of the first member 58 move away from the two sides of the blocking part 34. As such, the first locking device 54 no longer locks the blocking part 34, in order to allow the second rail 26 to be further moved relative to the first rail 24 from the first predetermined position P1 along the first direction D1.

Figure 9:
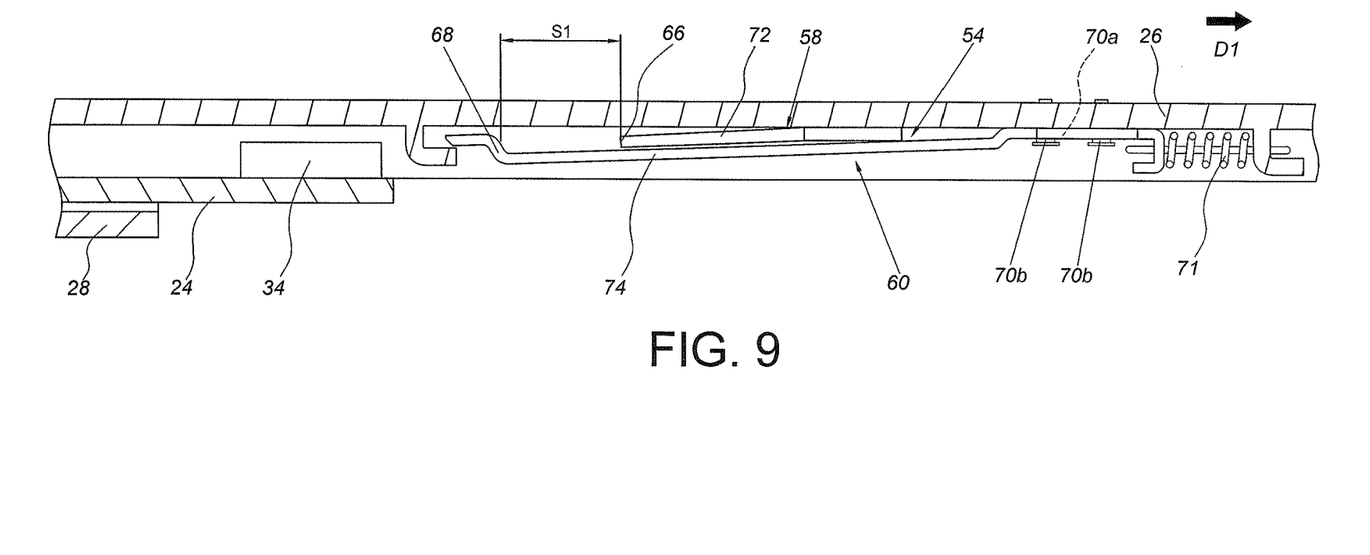
FIG. 9 is a diagram showing a second member of the first locking device being moved such that the first locking device cannot lock the first rail according to the first embodiment of the present invention.

As shown in FIG. 8 and FIG. 9, when the first locking device 54 is operated to unlock the blocking part 34, the elastic member 71 immediately releases the elastic force to drive the second member 60 to move relative to the first member 58. Therefore, the space between the first part 66 of the first member 58 and the second part 68 of the second member 60 can be changed from the second space S2 to the first space S1. Wherein, the first space S1 is not able to accommodate the blocking part 34. In such state, the first locking device 54 cannot lock the blocking part 34 of the first rail 24.

Figure 10:
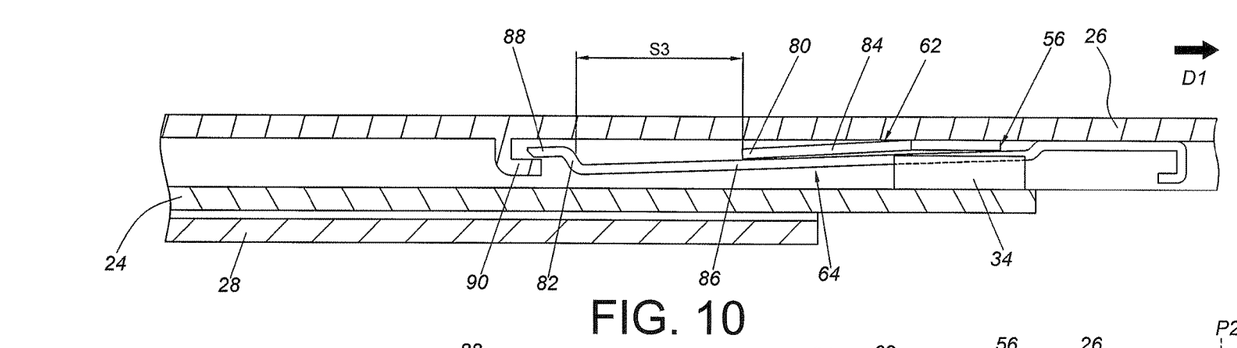
FIG. 10 is a diagram showing the second rail being further moved along the first direction according to the first embodiment of the present invention.
Figure 11:
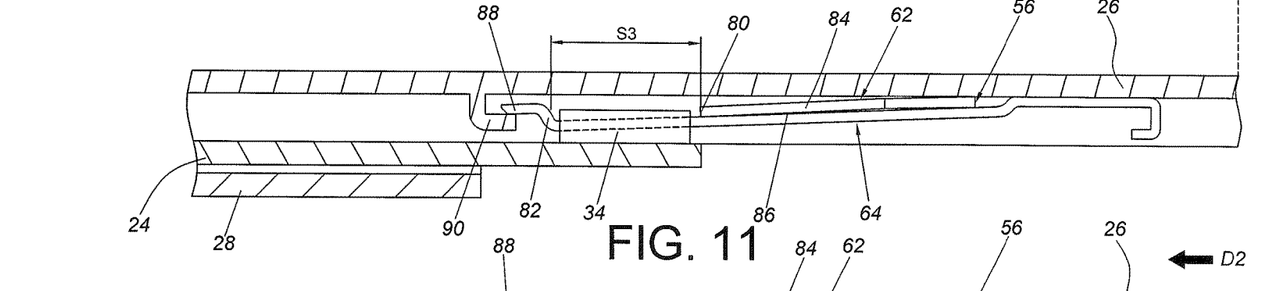
FIG. 11 is a diagram showing the second rail being locked to the first rail through a second locking device when the second rail is located at a second predetermined position according to the first embodiment of the present invention.

As shown in FIG. 10 and FIG. 11, when the first locking device 54 is operated to unlock the blocking part 34, the second rail 26 can be further moved relative to the first rail 24 from the first predetermined position P1 along the first direction D1. During such process, the third elastic section 84 of the third member 62 is temporarily pressed by the blocking part 34 to accumulate elastic energy. When the second rail 26 is moved to a second predetermined position P2, the third elastic section 84 of the third member 62 releases the elastic energy, and the third space S3 defined between the third part 80 of the third member 62 and the fourth part 82 of the fourth member 64 is configured to accommodate the blocking part 34 of the first rail 24, in order to lock the blocking part 34 to the second locking device 56. In other words, the third part 80 and the fourth part 82 of the second locking device 56 can respectively block the two sides of the blocking parts 34 of the first rail 24. As such, the second rail 26 can be prevented from moving relative to the first rail 24 along the first direction D1 or the second direction D2 (the direction opposite to the first direction D1). In such state, the slide rail assembly 20 has a second extension length, and the second rail 26 is in a second extension state relative to the first rail 24, such as in a fully extended state (as shown in FIG. 11).

Figure 12:
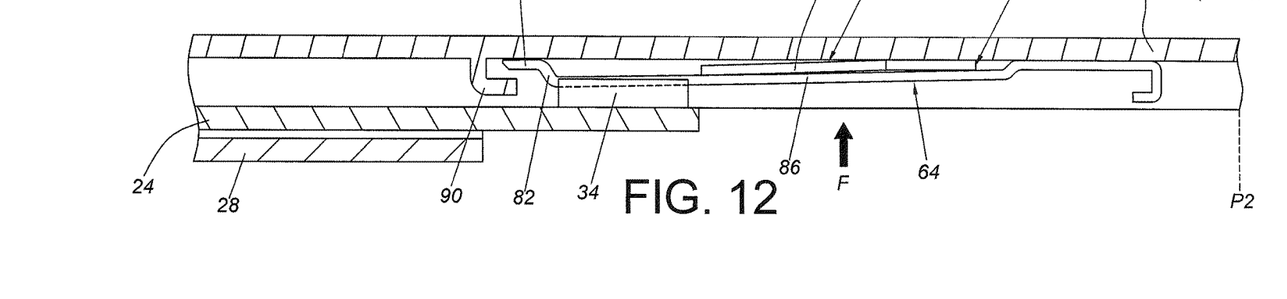
FIG. 12 is a diagram showing the second locking device being operated to allow the second rail to be movable relative to the first rail along a second direction according to the first embodiment of the present invention.

As shown in FIG. 12, the user can apply a force F to the fourth elastic section 86 of the fourth member 64 and the third elastic section 84 of the third member 62 in order to disengage the blocking part 34 from the second locking device 56. In addition, since the space between the first member 58 and the member 60 of the first locking device 54 is changed to the first space S1 (please also refer to FIG. 9), the first locking device 54 cannot lock the blocking part 34, such that the second rail 26 can be moved relative to the first rail 24 from the second predetermined position P2 directly to the retracted position R along a second direction D2.

Figure 13:
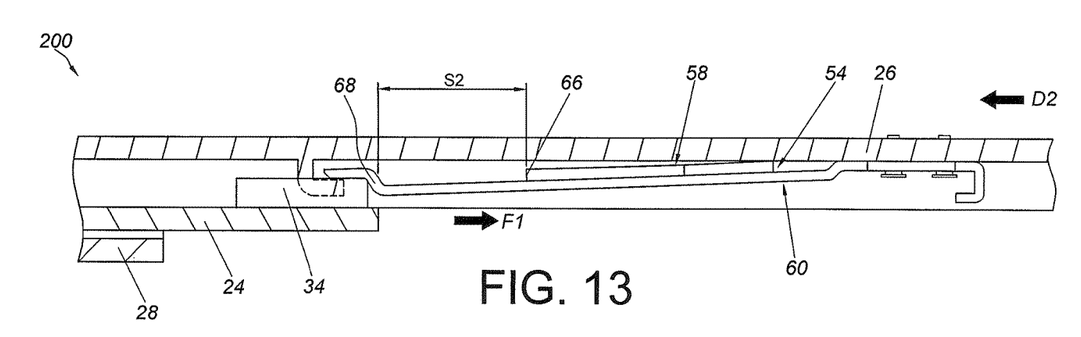
FIG. 13 is a diagram showing the first locking device contacting the blocking part of the first rail during a process of the second rail of the slide rail assembly being moved along the second direction according to a second embodiment of the present invention.
Figure 14:
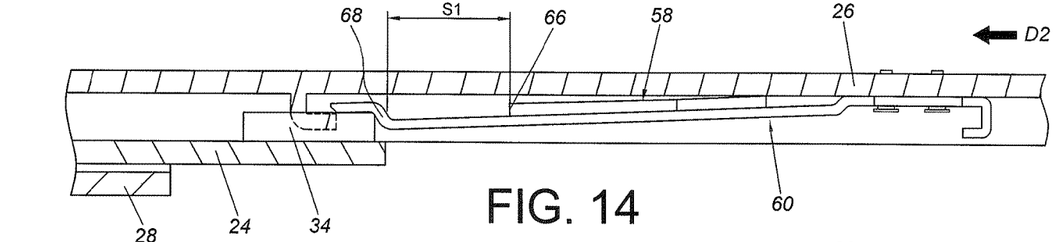
FIG. 14 is a diagram showing the second member of the first locking device of the slide rail assembly being pushed to move by the blocking part of the first rail such that the first locking device cannot lock the first rail according to the second embodiment of the present invention.
Figure 15:
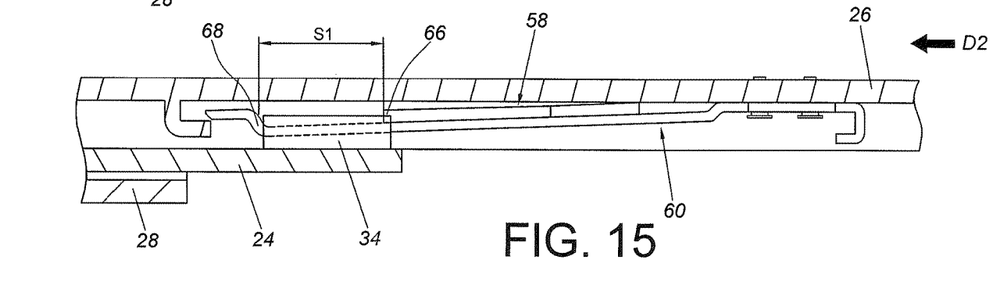
FIG. 15 is a diagram showing the second rail being moved relative to the first rail along the second direction according to the second embodiment of the present invention.

FIG. 13, FIG. 14 and FIG. 15 are diagrams showing a slide rail assembly 200 according to another embodiment of the present invention. Different from the previous embodiment, the slide rail assembly 200 does not comprise the elastic member 71.

Specifically, in a state that the slide rail assembly 200 does not comprise the elastic member 71, the space between the first part 66 of the first member 58 and the second part 68 of the second member 60 can also be changed from the second space S2 to the first space S1, such that the second rail 26 can be moved relative to the first rail 24 from the second predetermined position P2 directly to the retracted position R along the second direction D2.

For example, when the second rail 26 is moved from the second predetermined position P2 along the second direction D2 to be close to the blocking part 34 of the first rail 24, the second part 68 of the second member 60 abuts against the blocking part 34 (preferably, one of the second part 68 of the second member 60 and the blocking part 34 of the first rail 24 has an inclined surface or an arc surface) for generating a force F1 to push the second member 60 to move along the direction opposite to the second direction D2, such that the space between the first part 66 of the first member 58 and the second part 68 of the second member 60 is changed from the second space S2 to the first space S1, which cannot accommodate the blocking part 34 of the first rail 24. In other words, the first locking device 54 cannot lock the blocking part 34 of the first rail 24, such that the second rail 26 can be retracted relative to the first rail 24 directly toward the retracted position R along the second direction D2.

Therefore, the slide rail assembly of the present invention is characterized in that:

1. The first locking device 54 and the second locking device 56 are configured to lock the slide rail (such as the second rail 26) of the slide rail assembly 20, 200 at different positions, in order to allow the slide rail assembly 20, 200 to have different extension lengths. Therefore, the slide rail assembly 20 can be adapted to different mounting environments and meet specific requirements for equipment maintenance.

2. One of the first member 58 and the second member 60 of the first locking device 54 can be adjusted to move, in order to change a size of the space between the first part 66 of the first member 58 and the second part 68 of the second member 60 (such as the first space S1 or the second space S2) for interacting with an object (such as the blocking part 34 of the first rail 24).

3. The slide rail assembly 20, 200 can be expanded to lock the second rail 26 in two extension states. Even if the second rail 26 is located at the second predetermined position P2, the second rail 26 can be completely retracted by simply operating the locking device to unlock the second rail 26, so as to increase convenience in operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail comprising a blocking part;
a second rail movable relative to the first rail;
a first locking device arranged on the second rail, the first locking device comprising a first member and a second member, the first member comprising a first part, the second member comprising a second part, a first space being defined between the first part and the second part, wherein the first space is not able to accommodate the blocking part; and
a second locking device arranged on the second rail, the second locking device comprising a third member and a fourth member, the third member comprising a third part, the fourth member comprising a fourth part;
wherein during a process of the second rail being moved relative to the first rail from a retracted position to a first predetermined position along a first direction, the second part of the second member is blocked by the blocking part of the first rail, and the first member is moved with the second rail along the first direction, such that a second space is defined between the first part and the second part, the second space is configured to accommodate the blocking part of the first rail, in order to lock the blocking part to the first locking device;
wherein when the first locking device is operated to unlock the blocking part, and the second rail is further moved relative to the first rail to a second predetermined position along the first direction, a third space defined between the third part and the fourth part is configured to accommodate the blocking part of the first rail, in order to lock the blocking part to the second locking device.

2. The slide rail assembly of claim 1, wherein when the second locking device is operated to unlock the blocking part, the second rail is movable relative to the first rail from the second predetermined position to the retracted position along a second direction.

3. The slide rail assembly of claim 1, wherein the first member is fixed to the second rail, and the second member is movable relative to the second rail within a limited range through a guiding feature.

4. The slide rail assembly of claim 1, wherein the first member further comprises a first elastic section, the first part is arranged at an end of the first elastic section, the second member further comprises a second elastic section, the second part is arranged at an end of the second elastic section.

5. The slide rail assembly of claim 4, wherein the first elastic section is located between the second rail and the second elastic section, and the first elastic section and the second elastic section are tilted relative to the second rail.

6. The slide rail assembly of claim 5, wherein the second member further comprises a first extension section connected to the second elastic section, the second rail further comprises a first supporting part configured to abut against the first extension section.

7. The slide rail assembly of claim 1, wherein the third member further comprises a third elastic section, the third part is arranged at an end of the third elastic section, the fourth member further comprises a fourth elastic section, the fourth part is arranged at an end of the fourth elastic section.

8. The slide rail assembly of claim 7, wherein the third elastic section is located between the second rail and the fourth elastic section, and the third elastic section and the fourth elastic section are tilted relative to the second rail.

9. The slide rail assembly of claim 8, wherein the fourth member further comprises a second extension section connected to the fourth elastic section, the second rail further comprises a second supporting part configured to abut against the second extension section.

10. The slide rail assembly of claim 1, wherein the first rail has a front end and a rear end, the blocking part is arranged adjacent to the front end.

11. The slide rail assembly of claim 1, wherein the first locking device and the second locking device are arranged at different positions on the second rail along a longitudinal direction of the second rail.

12. The slide rail assembly of claim 3, further comprising an elastic member configured to apply an elastic force to the second member.

13. A slide rail assembly, comprising:
a first rail comprising a blocking part;
a second rail movable relative to the first rail; and
a first locking device arranged on the second rail, the first locking device comprising a first part and a second part, a first space being defined between the first part and the second part and unable to accommodate the blocking part, wherein when the second rail is located at a first predetermined position relative to the first rail, a second space is defined between the first part and the second part and configured to accommodate the blocking part, the first part and the second part of the first locking device are configured to respectively block two sides of the blocking part of the first rail;
wherein the first locking device comprises a first member and a second member, the first member comprises the first part, the second member comprises the second part, the first member is fixed to the second rail, and the second member is movably mounted to the second rail through a guiding feature;
wherein the slide rail assembly further comprises a second locking device arranged on the second rail, wherein the second locking device comprises a third member and a fourth member, the third member comprises a third part, the fourth member comprises a fourth part, a third space is defined between the third part and the fourth part; wherein when the second rail is located at a second predetermined position relative to the first rail, the third space is configured to accommodate the blocking part of the first rail, and the third part and the fourth part are configured to respectively block two sides of the blocking part of the first rail.

14. The slide rail assembly of claim 13, further comprising an elastic member configured to apply an elastic force to the second member.

15. A rail kit, comprising:
a slide rail; and
a first locking device arranged on the slide rail, the first locking device comprising a first member and a second member, wherein the first member is fixed to the slide rail, the second member is movably mounted to the slide rail; wherein when the second member is moved relative to the slide rail, a first space defined between the first member and the second member is changed to a second space; wherein the second space is larger than the first space;
wherein when the second member is blocked by an object to move relative to the slide rail, the second space defined between the first member and the second member is configured to accommodate the object, in order to lock the object to the slide rail; wherein the first space is not able to accommodate the object wherein the first member comprises a first elastic section and a first part arranged at an end of the first elastic section, the second member comprises a second elastic section and a second part arranged at an end of the second elastic section, the first space is defined between the first part and the second part, the first elastic section is located between the slide rail and the second elastic section, and the first elastic section and the second elastic section are tilted relative to the slide rail, wherein the second member further comprises a first extension section connected to the second elastic section, the slide rail further comprises a first supporting part configured to abut against the first extension section;
wherein the rail kit further comprises a second locking device arranged on the slide rail, wherein the second locking device comprises a third member and a fourth member, the third member comprises a third elastic section and a third part arranged at an end of the third elastic section, the fourth member comprises a fourth elastic section and a fourth part arranged at an end of the fourth elastic section, the third space is defined between the third part and the fourth part, the third elastic section is located between the slide rail and the fourth elastic section, and the third elastic section and the fourth elastic section are tilted relative to the slide rail, wherein the fourth member further comprises a second extension section connected to the fourth elastic section, the slide rail further comprises a second supporting part configured to abut against the second extension section.

16. The rail kit of claim 15, further comprising an elastic member configured to apply an elastic force to the second member.

* * * * *